US007462437B2

(12) United States Patent
Hoshi et al.

(10) Patent No.: US 7,462,437 B2
(45) Date of Patent: Dec. 9, 2008

(54) PRESENSITIZED LITHOGRAPHIC PLATE COMPRISING SUPPORT AND HYDROPHILIC IMAGE-RECORDING LAYER

(75) Inventors: Satoshi Hoshi, Shizuoka (JP); Kazuto Shimada, Shizuoka (JP); Gaku Kumada, Shizuoka (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 11/213,819

(22) Filed: Aug. 30, 2005

(65) Prior Publication Data

US 2006/0046194 A1 Mar. 2, 2006

(30) Foreign Application Priority Data

Aug. 31, 2004 (JP) ............................ 2004-252797
Dec. 21, 2004 (JP) ............................ 2004-370240

(51) Int. Cl.
*G03F 7/00* (2006.01)
*G03F 7/004* (2006.01)

(52) U.S. Cl. ................. 430/270.1; 430/278.1; 430/302; 430/309; 430/434; 430/435; 430/494; 430/944; 430/945

(58) Field of Classification Search .............. 430/270.1, 430/278.1, 302, 309, 434, 435, 494, 944, 430/945

See application file for complete search history.

(56) References Cited

U.S. PATENT DOCUMENTS

| | | | | | |
|---|---|---|---|---|---|
| 5,853,958 | A * | 12/1998 | Cheng et al. | ............. | 430/286.1 |
| 5,922,512 | A * | 7/1999 | DoMinh | ..................... | 430/302 |
| 6,159,657 | A | 12/2000 | Fleming et al. | | |
| 6,242,155 | B1 * | 6/2001 | Yamasaki et al. | ........ | 430/270.1 |
| 6,451,500 | B1 * | 9/2002 | Leon | ....................... | 430/270.1 |
| 6,740,464 | B2 * | 5/2004 | Maemoto | .................... | 430/138 |
| 6,841,335 | B2 * | 1/2005 | West et al. | ............... | 430/280.1 |
| 2001/0018159 | A1 * | 8/2001 | Maemoto | .................... | 430/138 |
| 2002/0142247 | A1 * | 10/2002 | Kawamura et al. | ....... | 430/270.1 |
| 2006/0029881 | A1 * | 2/2006 | Tao et al. | ................. | 430/270.1 |

FOREIGN PATENT DOCUMENTS

| | | | |
|---|---|---|---|
| EP | 0 755 803 | A1 | 1/1997 |
| EP | 1132200 | A2 * | 9/2001 |
| WO | WO-96/34316 | A1 | 10/1996 |

* cited by examiner

*Primary Examiner*—Amanda C. Walke
(74) *Attorney, Agent, or Firm*—Birch, Stewart, Kolasch & Birch, LLP

(57) ABSTRACT

A presensitized lithographic plate comprises a support and a hydrophilic image-recording layer. The hydrophilic image-recording layer contains a hydrophilic polymer and an agent capable of converting hydrophilic to hydrophobic when the agent is heated. The hydrophilic polymer comprises a main chain and branched chains. Each of the branched chain comprises a hydrophilic chain having a molecular weight in the range of 200 to 1,000,000. A hydrophilic substrate and a lithographic printing process are also disclosed.

14 Claims, No Drawings

PRESENSITIZED LITHOGRAPHIC PLATE COMPRISING SUPPORT AND HYDROPHILIC IMAGE-RECORDING LAYER

FIELD OF THE INVENTION

The present invention relates to a presensitized lithographic plate comprising a support and a hydrophilic image-recording layer containing a hydrophilic polymer and an agent capable of converting hydrophilic to hydrophobic when the agent is heated. The invention also relates to a hydrophilic substrate comprising a support and hydrophilic layer. The invention further relates to a presensitized lithographic process without conducting development or with conducting on press development.

BACKGROUND OF THE INVENTION

A presensitized lithographic plate has recently been remarkably researched and developed to be used for a Computer to Plate system. A recently proposed presensitized lithographic plate can be attached to a press machine to print an image without development after exposing the plate to light. Another presensitized lithographic plate can be printed on a printing machine after exposing the plate to light on the printing machine. The processing steps can be simplified, and problems of a waste processing solution can be solved by using the recently proposed lithographic plates.

Each of Japanese Patent No. 2,938397, Japanese Patent Provisional Publication No. 9(1997)-127683 and International Publication No. 99/10186 discloses a heat-sensitive presensitized lithographic plate comprising a substrate having a hydrophilic surface and a hydrophilic image-forming layer in which thermoplastic polymer particles are dispersed in matrix (e.g., a hydrophilic resin). The image-recording layer can be heated by converting light (infrared ray) to heat. In the heated image-recording layer, the thermoplastic polymer particles melt and fuse to form a hydrophobic image area on a surface of the hydrophilic image-recording layer. The lithographic plate in which an image has been formed is attached to a cylinder of a printer. The unheated area is removed by applying dampening water and ink to the plate while rotating the cylinder. A conventional developing process in an automatic developing machine can be replaced with the above-described on press development.

Japanese Patent Provisional Publication No. 2000-238452 discloses on press development of a lithographic printing plate having an image-recording layer containing an infrared absorbing agent and micro gel having a surface comprising a functional group to be decomposed with light or thermal energy.

The conventional lithographic plate for on press development has some problems. For example, removal of the unexposed area depends on starting conditions of a press machine. Accordingly, several tens or hundreds sheets should be uselessly printed before obtaining good printed matter. Further, dampening water and rollers for the water is contaminated with a lipophilic component, which has been removed from the plate. Therefore, the rollers should often be washed.

Research Disclosure No. 33302 (January, 1992) discloses a heat-sensitive presensitized lithographic plate having a heat-sensitive layer in which thermoplastic polymer particles are dispersed in a cross-linked hydrophilic resin. Further, each of Japanese Patent Provisional Publication Nos. 7(1995)-1849, 7(1995)-1850, 10(1998)-6468 and 11(1999)-70756 discloses a heat-sensitive presensitized lithographic plate have a hydrophilic layer in which microcapsules (lipophilic particles) are dispersed in a cross-linked hydrophilic binder polymer. Each of the microcapsules contains a lipophilic component. The heat-sensitive presensitized lithographic plate can be heated by light exposure to form a lipophilic image area. The formed surface structure consists of the lipophilic image area and an unexposed hydrophilic non-image area. The surface structure can be used as a surface for lithographic print using dampening water without conducting development (including on press development).

However, the hydrophilic layer provided on a support is not sufficiently hydrophilic. Further, the durability of the hydrophilic layer is also insufficient. Accordingly, the background of an image is gradually contaminated depending on printing conditions.

The conventional hydrophilic layer comprises an acrylamide-hydroxyethyl acrylate copolymer hardened with a methylolmelamine cross-linking agent (described in Japanese Patent Provisional Publication No. 2002-370467), gelatin or polyvinyl alcohol (described in Japanese Patent Provisional Publication No. 11(1999)-95417), or a hydrophilic heat-sensitive polymer comprising a repeating unit containing a group of a quaternary ammonium carboxylate. The conventional hydrophilic layer has an insufficient hydrophilic function of keeping dampening water. Therefore, ink cannot sufficiently be repelled to cause contamination within the hydrophilic non-image area.

SUMMARY OF THE INVENTION

An object of the present invention is to provide a presensitized lithographic plate which can be printed after exposure without conducting development.

Another object of the invention is to provide a presensitized lithographic plate improved in print wear.

A further object of the invention is to provide a presensitized lithographic plate having an excellent function of repelling ink to form an image free from contamination within non-image area.

A furthermore object of the invention is to provide a hydrophilic substrate improved in print wear and power of keeping water.

The present invention provides a presensitized lithographic plate of (1) to (9), a hydrophilic substrate of (10) and a lithographic process of (11) to (13).

(1) A presensitized lithographic plate which comprises a support and a hydrophilic image-recording layer containing a hydrophilic polymer and an agent capable of converting hydrophilic to hydrophobic when the agent is heated, wherein the hydrophilic polymer comprises a main chain and branched chains, each of said branched chain comprising a hydrophilic chain having a mass average molecular weight in the range of 200 to 1,000,000.

(2) The presensitized lithographic plate as defined in (1), wherein the branched chain comprises a hydrophilic chain and a linking group, said linking group intervening between the main chain and the hydrophilic chain.

(3) The presensitized lithographic plate as defined in (2), wherein the linking group comprises an ionic bond.

(4) The presensitized lithographic plate as defined in (1), wherein the main chain comprises at least two kinds of repeating units.

(5) The presensitized lithographic plate as defined in (4), wherein the branched chain is attached to only one kind of the repeating units of the main chain.

(6) The presensitized lithographic plate as defined in (5), wherein the branched chain comprises a hydrophilic chain and a linking group, said linking group intervening between the main chain and the hydrophilic chain, and wherein another kind of the repeating units of the main chain has the same molecular structure as the linking group.

(7) The presensitized lithographic plate as defined in (1), wherein the main chain has a mass average molecular weight in the range of 1,000 to 2,000,000.

(8) The presensitized lithographic plate as defined in (1), wherein the main chain has a cross-linked structure.

(9) The presensitized lithographic plate as defined in (8), wherein the cross-linked structure comprises an ionic bond.

(10) A hydrophilic substrate which comprises a support and a hydrophilic layer containing a hydrophilic polymer, wherein the hydrophilic polymer comprises a main chain and branched chains, each of said branched chain comprising a hydrophilic chain having a mass average molecular weight in the range of 200 to 1,000,000. lithographic printing process as defined in claim 1, wherein the hydrophilic support comprises an aluminum plate.

(11) A lithographic printing process which comprises the steps of:

imagewise heating a presensitized lithographic plate which comprises a support and a hydrophilic image-recording layer containing a hydrophilic polymer and an agent capable of converting hydrophilic to hydrophobic when the agent is heated, wherein the hydrophilic polymer comprises a main chain and branched chains, each of said branched chain comprising a hydrophilic chain having a mass average molecular weight in the range of 200 to 1,000,000, whereby a part of the hydrophilic layer is converted to a hydrophobic area to form a lithographic plate having a surface which comprises a hydrophilic area and the hydrophobic area; and then printing an image while supplying dampening water and oily ink to the lithographic plate.

(12) A lithographic printing process which comprises the steps of:

imagewise removing a part of a hydrophobic image-recording layer from a presensitized lithographic plate which comprises a hydrophilic substrate and the hydrophobic image-recording layer, said hydrophilic substrate comprising a support and a hydrophilic image-recording layer containing a hydrophilic polymer, wherein the hydrophilic polymer comprises a main chain and branched chains, each of said branched chain comprising a hydrophilic chain having a mass average molecular weight in the range of 200 to 1,000,000 to form a lithographic plate having a surface which comprises a hydrophilic area consisting of the exposed hydrophilic layer and a hydrophobic area consisting of the remaining hydrophobic image-recording layer; and then printing an image while supplying dampening water and oily ink to the lithographic plate.

(13) A lithographic printing process which comprises the steps of:

imagewise attaching a hydrophobic substance to a hydrophilic substrate comprising a support and a hydrophilic image-recording layer containing a hydrophilic polymer, wherein the hydrophilic polymer comprises a main chain and branched chains, each of said branched chain comprising a hydrophilic chain having a mass average molecular weight in the range of 200 to 1,000,000 to form a lithographic plate having a surface which comprises a hydrophilic area consisting of the hydrophilic layer and a hydrophobic area to which the hydrophobic substance is attached; and then printing an image while supplying dampening water and oily ink to the lithographic plate.

The present inventors have found a specific hydrophilic polymer comprising a main chain and branched chains, each of which comprises a hydrophilic chain having a mass average molecular weight in the range of 200 to 1,000,000 (preferably in the range of 1,000 to 1,000,000). The present inventors have noted that the above-mentioned specific hydrophilic polymer is highly hydrophilic. Further, a hydrophilic layer containing the specific hydrophilic polymer is excellent in strength (print wear). The hydrophilic polymer can have a three-dimensional polymeric molecular structure, which has a high density and an excellent strength. The specific hydrophilic polymer can be obtained by reacting a hydrophilic (starting) polymer having a reactive group at one terminal end with a chemically binding agent. After the chemical reaction, the terminal end of the hydrophilic chain is fixed with the chemical bond to the three-dimensional molecular structure of the hydrophilic polymer. In the case that two or more chemically binding agents are used at the reaction, the density and the strength of the hydrophilic polymer can be further improved.

In the three-dimensional molecular structure of the hydrophilic polymer, the hydrophilic chain is fixed at only one terminal end, and the other ends are not fixed. Accordingly, the hydrophilic chain has a high degree of freedom. The hydrophilic chain has a structure excellent in motion.

For the reasons mentioned above, dampening water can be efficiently supplied to and excluded from a lithographic printing plate prepared from the presensitized lithographic plate according to the present invention. Further, the three-dimensional molecular structure of the hydrophilic polymer can have many branched chains comprising hydrophilic chains. Therefore, the hydrophilic polymer can keep a necessary amount of dampening water. The highly hydrophilic layer, which keeps a large amount of dampening water, can repel oily ink to be scarcely contaminated within the non-image area.

A conventional presensitized lithographic plate without conducting development (completely process free plate) usually contains a cross-linked hydrophilic polymer in a hydrophilic layer. The cross-linked hydrophilic polymer is prepared by cross-linking hydrophilic groups of the polymer with a cross-linking agent. The conventional cross-linked hydrophilic polymer has a low degree of freedom. Therefore, the conventional polymer can keeps only a small amount of dampening water The above-mentioned hydrophilic layer of the present invention improved in the strength and the hydrophilic function can be used not only as an image-recording layer containing an agent capable of converting hydrophilic to hydrophobic when the agent is heated but also as a hydrophilic layer of a hydrophilic substrate comprising a support and the hydrophilic layer. For example, a lithographic printing plate having an excellent hydrophilic area can be obtained by forming a hydrophobic image-recording layer (which can be removed from the hydrophilic substrate according to an image) on the substrate or by directly forming a hydrophobic image on the substrate.

DETAILED DESCRIPTION OF THE INVENTION

[Hydrophilic Polymer]

A hydrophilic polymer comprises a main chain and branched chains. The branched chain is combined to the main chain at only one terminal end of the branched chain. The hydrophilic polymer preferably comprises 3 or more, more preferably comprises 5 or more, and most preferably comprises 10 or more branched chains.

The branched chain comprises a hydrophilic chain having a mass average molecular weight in the range of 200 to 1,000,000.

The branched chain preferably comprises the hydrophilic chain and a linking group, which intervenes between the main chain and the hydrophilic chain. The linking group can comprise an ionic bond. The hydrophilic characteristics of the hydrophilic binder can be improved by introducing an ionic bond into the linking group.

The amount of the branched chain is preferably in the range of 10 to 95 weight %, more preferably in the range of 20 to 90 weight %, and most preferably in the range of 30 to 80 weight % based on the total amount of the hydrophilic layer.

The main chain means a backbone at which branched chains are branched. The main chain can be shorter than the branched chain or the hydrophilic chain. The main chain can be an oligomer of a relatively low molecular weight. The main chain can also be a polymer having a mass average molecular weight in the range of 200 to 1,000,000, or a cross-linked polymer.

The main chain preferably comprises two or more kinds of repeating units. The branched chain is preferably attached to only one kind of the repeating units of the main chain. In other words, the branched chain is preferably not attached to the other kinds of the repeating units of the main chain.

In the case that the branched chain comprises a hydrophilic chain and a linking group that intervenes between the main chain and the hydrophilic chain, another kind of the repeating units of the main chain can have the same molecular structure as the linking group. In the case that the main chain has a cross-linked structure, another kind of the repeating units of the main chain can have the same molecular structure as the cross-linked structure.

The cross-linked structure can comprise an ionic bond. The hydrophilic characteristics of the hydrophilic binder can be improved by introducing an ionic bond into the cross-linked structure.

(Hydrophilic Chain)

The hydrophilic chain can be formed by introducing a reactive group into only one terminal end of a hydrophilic starting polymer.

The hydrophilic starting polymer can be a natural polymer (e.g., polysaccharide, protein), a semi-synthetic polymer (e.g., starch derivative, cellulose ether, cellulose ester) or a synthetic polymer.

The main chain of the hydrophilic chain (not the main chain of the hydrophilic polymer) preferably is a hydrocarbon, a halogenated hydrocarbon, a polyester, a polyamide, a polyamine, a polyether, a polyurethane, a polyurea or a combination thereof, more preferably is a hydrocarbon, a polyether, a polyurethane, a polyurea or a combination thereof, and most preferably is a hydrocarbon. A part of carbon atoms of the hydrocarbon main chain can be replaced with hetero atoms (e.g., oxygen, nitrogen, sulfur, phosphor).

The hydrophilic chain has hydrophilic groups preferably at its side chain, main chain or as substituent groups as the side chain. The hydrophilic group preferably is carboxylic acid group, an amino group, a phosphoric acid group, a sulfonic acid group, hydroxyl, an amido group, a sulfonamido group, an alkoxy group, cyano or a polyoxyalkylene group (e.g., polyoxyethylene), and more preferably is a carboxylic acid group, an amino group, a sulfonic acid group, hydroxyl, an amido group or a polyoxyalkylene group.

The carboxylic acid group, the sulfonic acid group and the phosphoric acid group can be in the form of a salt. The counter cation the carboxylic acid group preferably is an ammonium ion or an alkali metal ion. The counter cation of the sulfonic acid group preferably is an ammonium ion, an alkali metal ion or an alkaline earth metal ion.

The amino group can be in the form of a cation (an ammonium ion) or a salt. The counter anion of the amino group preferably is a halide ion.

Each of the repeating units of the hydrophilic chain preferably has at least one hydrophilic group.

A linking group can intervene between the main chain of the hydrophilic chain and the hydrophilic group. The linking group preferably is —O—, —S—, —CO—, —NH—, —N<, an aliphatic group, an aromatic group, a heterocyclic group or a combination thereof.

The hydrophilic chain preferably is a polymer of ethylenically unsaturated monomers having a hydrophilic group. Examples of the hydrophilic ethylenically unsaturated monomers include (meth)acrylic acid and a salt thereof, itaconic acid and a salt thereof, a maleic acid and a salt thereof, 2-hydroxyethyl (meth)acrylate, hydroxypropyl (meth)acrylate, hydroxybutyl (meth)acrylate, (meth)acrylamide, N-monomethylol (meth)acrylamide, N,N-dimethylol (meth) acrylamide, 2-vinylpropionic acid and a salt thereof, vinylsulfonic acid and a salt thereof, 2-sulfoethyl (meth)acrylate and a salt thereof, polyoxyethylene glycol mono(meth)acrylate, 2-acrylamido-2-methylpropanesulfonic acid and a salt thereof, phosphooxypolyoxyethylene glycol mono(meth) acrylate and a salt thereof, allylamine and hydroxypropylene. The polymers of hydrophilic ethylenically unsaturated monomers further include polyvinyl alcohol, polyvinyl formal, polyvinyl butyral and polyvinyl pyrrolidone. The saponification degree of the polyvinyl alcohol is preferably not less than 60 weight %, and more preferably not less than 80 weight %.

The hydrophilic chain can be a homopolymer of hydrophilic ethylenically unsaturated monomers. The hydrophilic chain can also be a copolymer of two or more kinds of hydrophilic ethylenically unsaturated monomers. Further, the hydrophilic chain can also be a copolymer of two or more kinds of hydrophilic ethylenically unsaturated monomers.

A reactive group is introduced into only one terminal end of the hydrophilic chain. The reactive group means a functional group that can react with a reactive group of the main chain or a monomer forming the main chain to form a chemical bond. Accordingly, the reactive group of the hydrophilic chain is relatively determined depending on the reactive group of the main chain or the monomer thereof. A hydrophilic starting polymer (corresponding to a hydrophilic chain) is preferably soluble in water, while an obtained hydrophilic polymer (in which the hydrophilic chains are attached to the main chain) is preferably not soluble in water.

In the present specification, the chemical bonds includes a covalent bond, an ionic bond, a coordinate bond and a hydrogen bond in the same as the conventional meanings of the chemical bond. The chemical bond preferably is a covalent bond.

The reactive group is usually identical with a reactive group contained in a cross-linking agent of a polymer. The cross-linking agent is described in Shinzo Yamashita and Tosuke Kaneko, Polymer Handbook (written in Japanese), Taisei-sha, 1981.

Examples of the reactive groups include carboxyl (HOOC—), a salt thereof (MOOC—, wherein M is a cation), a carboxylic anhydride group (for example, monovalent groups derived from succinic anhydride, phthalic anhydride and maleic anhydride), amino ($H_2N$—), hydroxyl (HO—), an epoxy group (e.g., 1,2-epoxyethyl), methylol (HO—CH2—), mercapto (HS—), isocyanato (OCN—), a blocked isocyanato group, an alkoxysilyl group, an ethylenically unsaturated double bond, an ester bond and a tetrazole group. Two or more reactive groups can be attached to one terminal end. Two or more reactive groups can be different from each other.

The reactive group is preferably different from the hydrophilic group. The reactive group is preferably more reactive than the hydrophilic group. The term "reactive" should be relatively determined depending on a reactive group of a main chain or a monomer thereof.

A linking group preferably intervenes between the hydrophilic chain and the reactive group. The linking group preferably is —O—, —S—, —CO—, —NH—, —N<, an aliphatic group, an aromatic group, a heterocyclic group or a combination thereof, more preferably is —O—, —S—, or a combination including —O— or —S—. The linking group is preferably attached to the hydrophilic chain at the —O— or —S—.

The hydrophilic chain having the reactive group is preferably represented by the following formula (I).

(I)

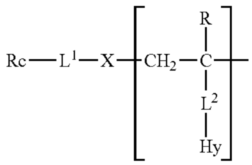

In the formula (I), Rc is a reactive group. The reactive group preferably is carboxyl, a salt thereof, a carboxylic anhydride group, amino, hydroxyl, an epoxy group (e.g., 1,2-epoxyethyl), methylol (H0-CH2—), mercapto (HS—), isocyanato (OCN—), a blocked isocyanato group, an alkoxysilyl group, an ethylenically unsaturated double bond, an ester bond and a tetrazole group. ydrophilic group.

In the formula (I), $L^1$ is a single bond or a divalent linking group. The divalent linking group preferably is —O—, —CO—, —NH—, a divalent aliphatic group, a divalent aromatic group, a divalent heterocyclic group or a combination thereof.

In the formula (I), X is —O— or —S—, —S— is preferred to —O—.

In the formula (I), R is hydrogen, a halogen atom or an alkyl group having 1 to 10 carbon atoms. R preferably is hydrogen or an alkyl group having 1 to 6 carbon atoms, more preferably is hydrogen or an alkyl group having 1 to 3 carbon atoms, and most preferably is hydrogen or methyl.

In the formula (I), Hy is a hydrophilic group. The hydrophilic group preferably is a carboxylic acid group, a salt thereof, an amino group, a salt thereof, a phosphoric acid group, a salt thereof, a sulfonic acid group, a salt thereof, hydroxyl, an amido group, a sulfonamido group, an alkoxy group, cyano or a polyoxyalkylene group.

In the formula (I), $L^2$ is a single bond or a divalent linking group. The divalent linking group preferably is —O—, —CO—, —NH—, a divalent aliphatic group, a divalent aromatic group, a divalent heterocyclic group or a combination thereof.

Examples of the hydrophilic chains having the reactive group at its terminal end are shown below.

EP-1

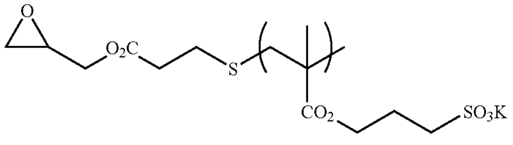

-continued

EP-2

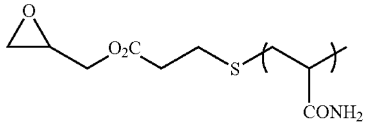

EP-3

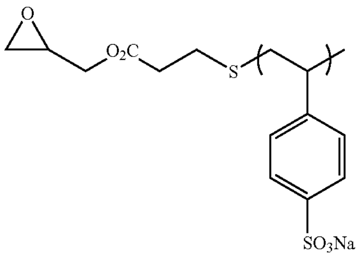

EP-4

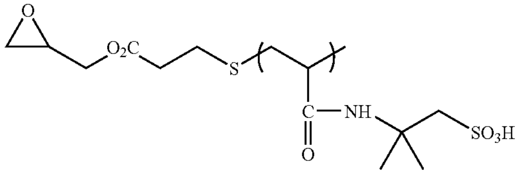

EP-5

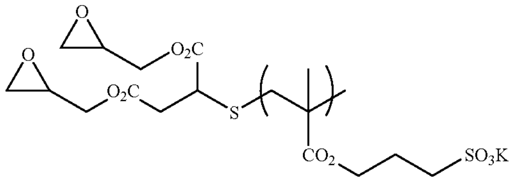

EP-6

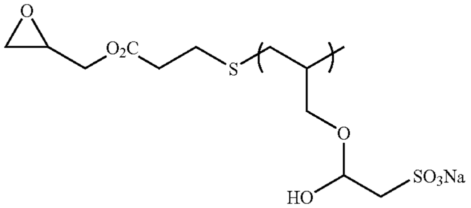

EP-7

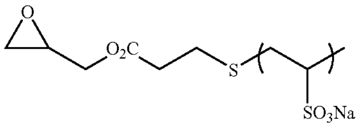

EP-8

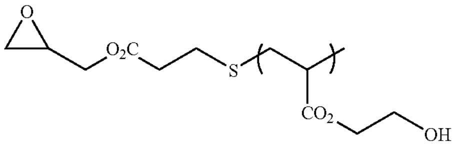

CA-1

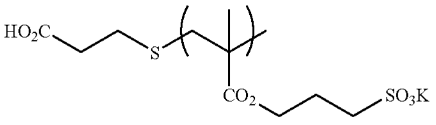

CA-2

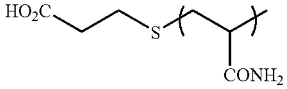

-continued
CA-3
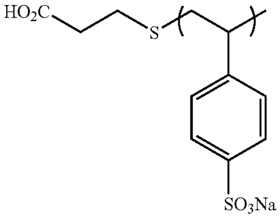
CA-4
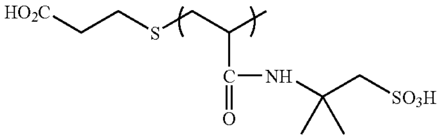
CA-5
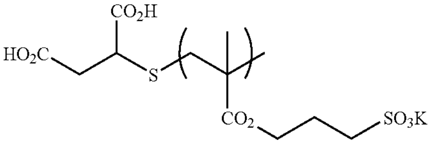
CA-6
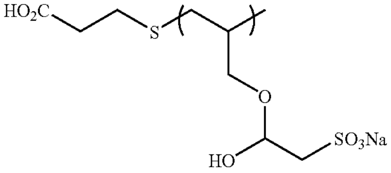
CA-7
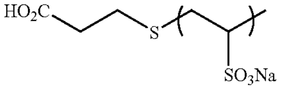
CA-8
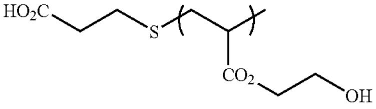
SI-1
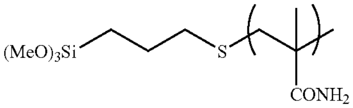
ES-1
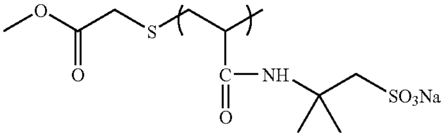
DB-1
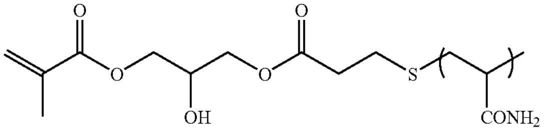
DB-2
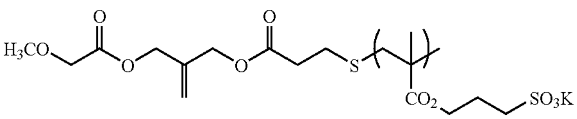
-continued
AL-1
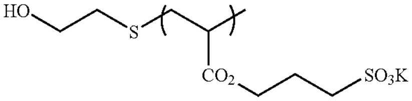
AL-2
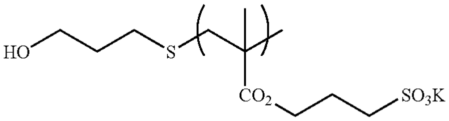
AL-3
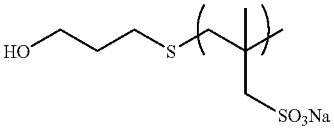
AL-4
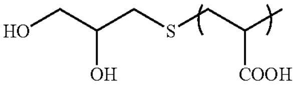
AL-5
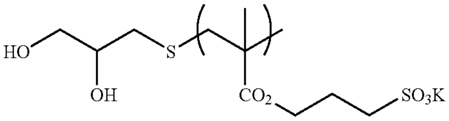
AL-6
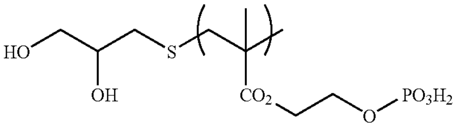
AL-7
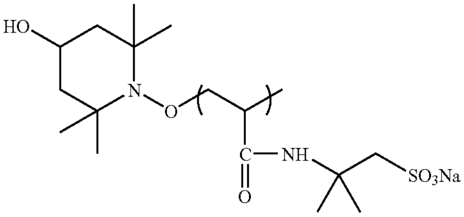
AL-8
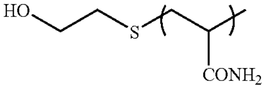
AM-1
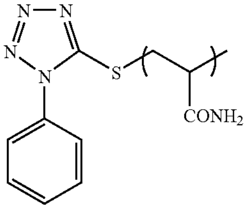
AM-2
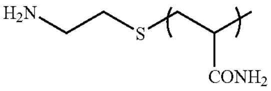
AM-3
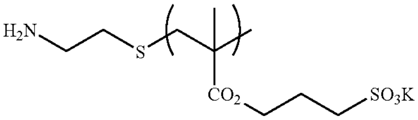

-continued

AM-4

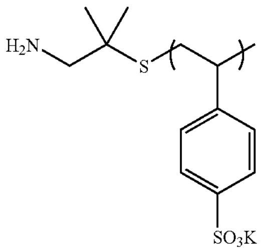

AM-5

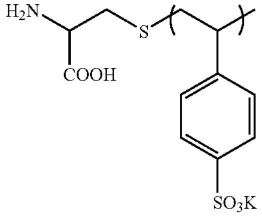

AM-6

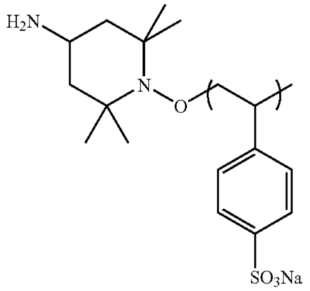

The hydrophilic chain having a reactive group at its terminal end can be synthesized, for example by polymerizing a hydrophilic monomer (e.g., acrylamide, acrylic acid, potassium 3-sulfopropyl methacrylate) with radical polymerization reaction in the presence of a chain transfer agent (described in Kanji Kamachi and Tsuyoshi Endo, Radical Polymerization Handbook (written in Japanese), NTS) or an Iniferter (described in Macromolecules 1986, 19, p. 287-, Otsu). Examples of the chain transfer agents include 3-mercaptopropionic acid, hydrochloric salt of 2-aminoethanethiol, 3-mercaptopropanol and 2-hydroxyethyl disulfide. A hydrophilic monomer (e.g., acrylamide) can be subjected to a radical polymerization by using a radical polymerization initiator having a reactive group (e.g., carboxyl) in place of the chain transfer agent. However, the radical polymerization using the chain transfer agents is preferred because it is easy to adjust the molecular weight of the synthesized polymer.

The hydrophilic chain having a reactive group at its terminal end has a mass average molecular weight preferably of not larger than 1,000,000, more preferably in the range of 200 to 1,000,000, and most preferably in the range of 1,000 to 100,000. If the molecular weight is larger than 1,000,000, it is difficult to dissolve the polymer in a solvent in preparation of a coating solution. Further, a coating solution containing a polymer of a high molecular weight has a high viscosity. It is difficult to form a uniform membrane form a viscous coating solution.

Two or more hydrophilic chain having a reactive group at its terminal end can be used in combination.

(Main Chain)

The main chain can be synthesized by using a compound having at least reactive groups (first embodiment of the present invention). At least one of the reactive groups can react with the reactive group at the terminal end of the hydrophilic chain to form a chemical bond. At least two of the reactive groups can react with each other to form a chemical bond.

The main chain can also be synthesized by using a compound A having at least two reactive groups and a compound B having at least three reactive groups (second embodiment of the present invention). At least one of the reactive groups of the compound A can react with the reactive group at the terminal end of the hydrophilic chain to form a chemical bond. At least one of the reactive groups of the compound B can react with another reactive group of the compound A to form a chemical bond, and at least two of the reactive groups of the compound B can react with each other to form a chemical bond. Alternatively, at least three of the reactive groups of the compound B can react with another reactive group of the compound A to form a chemical bond. The compound B can further have a reactive group that can react with the reactive group at the terminal end of the hydrophilic chain to form a chemical bond.

The compound for forming the main chain can be a monomer, an oligomer or a polymer. In the case that two or more compounds are used to form the main chain, the chemical bond between the compounds can be an ionic bond.

The compound for forming the main chain can be a cross-linking agent of a polymer. The cross-linking agent is described in Shinzo Yamashita and Tosuke Kaneko, Polymer Handbook (written in Japanese), Taisei-sha, 1981.

Examples of the reactive groups of the compound for forming the main chain include carboxyl, a salt thereof, a carboxylic anhydride group, amino, imino, hydroxyl, an epoxy group, an aldehyde group, methylol, mercapto, isocyanato, a blocked isocyanato group, an alkoxysilyl group, an ethylenically unsaturated double bond, a coordinate bond, an ester bond and a tetrazole group.

Examples of the compounds having carboxyl as the reactive group include α,ω-alkanedicarboxylic acids (e.g., succinic acid, adipic acid), α,ω-alkenedicarboxylic acids, polycarboxylic acids (e.g., 1,2,3-propanetricarboxylic acid, 1,2,3,4-butanetetracarboxylic acid, trimellitic acid, polyacrylic acid).

Examples of the compounds having amino or imino as the reactive group include an amine (e.g., butylamine, spermine, diaminocyclohexane, piperazine, aniline, phenylenediamine, 1,2-ethanediamine, diethylenediamine, diethylenetriamine).

Examples of the compounds having an epoxy group as the reactive group include polyepoxy compounds (e.g., ethylene glycol diglycidyl ether, propylene glycol diglycidyl ether, tetraethylene glycol diglycidyl ether, nonaethylene glycol diglycidyl ether, polyethylene glycol glycidyl ether, polypropylene glycol glycidyl ether, neopentyl glycol diglycidyl ether, 1,6-hexanediol diglycidyl ether, trimethylolpropane triglycidyl ether, sorbitol polyglycidyl ether).

Examples of the compounds having hydroxyl as the reactive group include alkylene glycols (e.g., ethylene glycol, propylene glycol), oligoalkylene glycols (e.g., diethylene glycol, tetraethylene glycol), polyalkylene glycols, polyols (e.g., trimethylolpropane, glycerin, pentaerythritol, sorbitol, polyvinyl alcohol).

Examples of the compounds having an aldehyde group as the reactive group include polyaldehydes (e.g., glyoxal, terephthalaldehyde).

Examples of the compounds having isocyanato or a blocked isocyanato group as the reactive group include polyisocyanate (e.g., tolylene diisocyanate, hexamethylene diisocyanate, diphenylmethane diisocyanate, xylylene diisocyanate, polymethylenepolyphenyl isocyanate, cyclohexyl diisocyanate, cyclohexanephenylene diisocyanate, naphthalene-1,5-diisocyanate, isopropylbenzene-2,4-diisocyanate, polypropylene glycol/tolylene diisociatate reaction adduct) and blocked polyisocyanate compounds.

Examples of the compounds having an alkoxysilyl group as the reactive group include silane coupling agents (e.g., tetraalkoxysilane).

Examples of the compounds having a coordinate bond as a reactive group include metallic cross-linking agents (e.g., aluminum acetylacetonato, copper acetylacetonato, iron(III) acetylacetonato).

Examples of the compounds having methylol as the reactive group include polymethylol compounds (e.g., trimethylolmelamine, pentaerythritol).

Examples of the compounds having mercapto as the reactive group include polythiol compounds (e.g., dithioerythritol, pentaerythritol-tetrakis(2-mercaptoacetate), trimethylolpropane tris(2-mercaptoacetate)).

The compound for forming the main chain is preferably soluble in water.

The compound for forming the main chain can be in the form of a polymer, which can have a mass average molecular weight in the range of 1,000 to 2,000,000 and a 10 or more reactive groups. In the case that a polymer used to form the main chain, a hydrophilic polymer of a high molecular weight can be synthesized by a few reactions to improve strength of the hydrophilic layer.

The polymer can have a reactive group to another compound for forming the main chain. The reactive group preferably is an ionic (anionic or cationic) group. Examples of the anionic groups include a carboxylic acid group, a sulfonic acid group, a phosphoric acid group, a phenolic hydroxyl group and salts thereof. Examples of the cationic groups include an amino group, an imino group and a nitrogen-containing heterocyclic group (e.g., pyridinyl, piperidinyl, piperazinyl).

Examples of the polymers having anionic groups include poly(meth)acrylic acid, salts thereof (e.g., sodium salt, ammonium salt), polystyrenesulfonic acid and copolymers thereof.

Examples of the polymers having cationic groups include polyvinyl amine, polyallyl amine, salts thereof (e.g., polyallyl amine chloride), polyethyleneimine, polyvinyl pyrrolidone and copolymers thereof.

A natural polymer (e.g., alginic acid, starch) or a semi-synthetic polymer (e.g., carboxymethyl cellulose) can be used as the polymer for forming the main chain.

(Binding of Hydrophilic Chain to Main Chain)

In the case that the reactive group at the terminal end of the hydrophilic chain is a carboxylic acid group or a salt thereof, the main chain or the monomer for forming the main chain preferably is a polyepoxy compound, a polyamine compound, a polymethylol compound, a polyisocyanate compound a blocked polyisocyanate compound or a metallic cross-linking agent.

In the case that the reactive group at the terminal end of the hydrophilic chain is a methylol group, a phenolic hydroxyl group or a glycidyl group, the main chain or the monomer for forming the main chain preferably is a polycarboxylic acid compound, a polyamine compound or a polyhydroxy compound.

In the case that the reactive group at the terminal end of the hydrophilic chain is an amino group, the main chain or the monomer forming the main chain preferably is a polyisocyanate compound, a blocked polyisocyanate compound, a polyepoxy compound or a polymethylol compound.

In the case that the reactive group at the terminal end of the hydrophilic chain is an alkoxysilyl group, the main chain or the monomer for forming the main chain preferably is tetraalkoxysilane or a polyhydric alcohol.

In the case that the reactive group at the terminal end of the hydrophilic chain is an ethylenically unsaturated double bond, the main chain or the monomer for forming the main chain preferably is a polythiol compound, an amine or an imine.

The reactions between monomers for forming the main chain are the same as the above-mentioned reaction between the main chain or the monomer thereof with the reactive group at the terminal end of the hydrophilic chain. Examples of the reactions between monomers for forming the main chain further include a reaction between epoxy groups.

An ionic group can be introduced into the main chain or a linking group between the hydrophilic chain and the main chain. On the other hand, the reactive group at the terminal end of the hydrophilic chain is preferably bound with a covalent bond to the reactive group of the linking group, the main chain or the monomer for forming the main chain.

It is preferred that the reactive group at the terminal end of the hydrophilic chain is an ethylenically unsaturated double bond, the main chain or the monomers for forming the main chain comprises two components, one component is an amine or an imine, and the other component has an anionic group. The ethylenically unsaturated bond of the hydrophilic chain can form a covalent bond with the amine or imine. The amine or the imine can form an ionic bond with the anionic group of the main chain or the monomers for forming the main chain.

It is also preferred that the reactive group at the terminal end of the hydrophilic chain is an epoxyalkyl group, the main chain or the monomers for forming the main chain comprises two components, one component is a carboxylic acid or a phenol (a compound having phenolic hydroxyl), an the other component has a cationic group. The epoxyalkyl group of the hydrophilic chain can form a covalent bond with the carboxylic acid or the phenol. The carboxylic acid or the phenol can form an ionic bond with the cationic group of the main chain or the monomers for forming the main chain.

It is particularly preferred that the reactive group at the terminal end of the hydrophilic chain is an epoxyalkyl group, the main chain or the monomers for forming the main chain comprises two components, one component is an amine or an imine, and the other component has an anionic group. The epoxyalkyl group of the hydrophilic chain can form a covalent bond with the amine or the imine. The amine or the imine can form an ionic bond with the anionic group of the main chain or the monomer for forming the main chain.

In the thee-dimensional structure of the hydrophilic polymer, only one terminal end is bound to the main chain. Accordingly, the hydrophilic chain has a high degree of freedom. The hydrophilic chain has a structure excellent in motion.

[Agent Capable of Converting Hydrophilic to Hydrophobic]

The hydrophilic image-recording layer can be converted to hydrophobic by the function of an agent capable of converting hydrophilic to hydrophobic contained in the hydrophilic image-recording layer.

The agent capable of converting hydrophilic to hydrophobic preferably is a compound (more preferably a polymer) that itself can be converted from hydrophilic to hydrophobic when it is heated, a thermoplastic, thermosetting or thermally reactive particle of a hydrophobic compound, or a microcapsule containing a hydrophobic compound.

The compound that can be converted from hydrophilic to hydrophobic preferably is a polymer having a hydrophilic group that can be decarboxylated with heat to form a hydrophobic group. On a coated hydrophilic layer of the compound that can be converted from hydrophilic to hydrophobic, a droplet of water preferably has a contact angle to the air of 20° or less. After heating the layer, the contact angle is preferably changed to 60° or more.

The hydrophobic compound for forming the thermoplastic, thermosetting or thermally reactive particle preferably is a polymer.

A thermoplastic polymer particle is described in Research Disclosure No. 33303 (1992, January), Japanese Patent Provisional Publication Nos. 9(1997)-123387, 9(1997)-171249, 9(1997)-171250 and European Patent No. 931647.

The thermoplastic polymer particle has an average particle size preferably in the range of 0.01 to 2.0 μm. The thermoplastic polymer particle can be prepared according to an emulsion polymerization process, a suspension polymerization process or a solution dispersing process. In the solution dispersing process, a monomer is dissolved in an organic solvent that is not dissolved in water, the solution is mixed and emulsified with an aqueous solution of a dispersing agent, the emulsion is heated to evaporate the organic solvent, and particles are solidified and formed.

The thermosetting polymer preferably is a resin having a phenol skeleton, a urea resin, a melamine resin, an alkyd resin, an unsaturated polyester resin, a polyurethane resin and an epoxy resin. The resin having a phenol skeleton, the melamine resin, the urea resin and the epoxy resin are preferred.

The thermosetting polymer particle has an average particle size preferably in the range of 0.01 to 2.0 μm. The thermosetting polymer particle can be prepared according to the solution dispersing process. The particle can be formed simultaneously with synthesis of the polymer.

The thermally reactive group of the thermally reactive polymer particle preferably is a radical polymerization group (e.g., acryloyl, methacryloyl, vinyl, allyl), a cationic polymerization group (e.g., vinyl, vinyloxy), an addition reaction group (e.g., an isocyanato group, a blocked isocyanato group, an epoxy group, vinyloxy) and a counter reactive group thereof comprising an active hydrogen atom (e.g., amino, hydroxyl, carboxyl), a condensation reactive group (e.g., carboxyl) and a counter reactive group thereof (e.g., hydroxyl, amino), a ring opening reactive group (e.g., an acidy anhydride) and a counter reactive group thereof (e.g., amino, hydroxyl).

The thermally reactive group can be introduced into a polymer while synthesizing the polymer.

In the case that the thermally reactive group is introduced into the polymer while synthesizing the polymer, a monomer having the thermally reactive group is preferably subjected to an emulsion polymerization or a suspension polymerization. Examples of the monomers having the thermally reactive group include allyl methacrylate, allyl acrylate, vinyl methacrylate, vinyl acrylate, 2-(vinyloxy)ethyl methacrylate, p-vinyloxystyrene, p-{2-(vinyloxy)ethyl}styrene, glycidyl methacrylate, glycidyl acrylate, 2-isocyanatoethyl acrylate or a blocked isocyanate-thereof, 2-isocyanatoethyl acrylate or a blocked isocyanate thereof, 2-aminoethyl methacrylate, 2-aminoethyl acrylate, 2-hydroxyethyl methacrylate, 2-hydroxyethyl acrylate, acrylic acid, methacrylic acid, maleic anhydride, a bifunctional acrylate and a bifunctional methacrylate. The isocyanate can be blocked for example with an alcohol.

The thermally reactive polymer can be a copolymer of a monomer having a thermally reactive group and another monomer (having no thermally reactive group). Examples of other monomers include styrene, an alkyl acrylate, an alkyl methacrylate, acrylonitrile and vinyl acetate.

After polymerization of a monomer, a thermally reactive group can be introduced into the formed polymer. The reaction of the polymer is described in International Publication No. 96/34316.

The thermally reactive polymer particle has an average particle size preferably in the range of 0.01 to 2.0 μm, more preferably in the range of 0.05 to 2.0 μm, and most preferably in the range of 0.1 to 1.0 μm.

A microcapsule containing a hydrophobic compound can function as an agent capable of converting hydrophilic to hydrophobic. The hydrophobic compound preferably has a thermally reactive group. The thermally reactive group is the same as the group of the thermally reactive polymer particle. Examples of the thermally reactive hydrophobic monomers include monomers having two or more ethylenically unsaturated groups in addition to the monomers for forming the thermally reactive hydrophobic particle. The monomers having two or more ethylenically unsaturated groups include acrylic esters of polyhydric alcohols (e.g., trimethylolpropane triacrylate, pentaerythritol tetraacrylate), methacrylic esters of polyhydric alcohols (e.g., dipentaerythritol dimethacrylate), itaconic esters of polyhydric alcohols (e.g., ethylene glycol diitaconate), maleic esters of polyhydric alcohol (e.g., ethylene glycol dimaleate) and polyvalent acrylamides (e.g., methylenebisacrylamide).

Microcapsule can be prepared according to a conventional process. For example, the microcapsule can be prepared according to a coacervation process (described in U.S. Pat. Nos. 2,800,457 and 2,800,458), an interfacial polymerization process (described in U.S. Pat. No. 3,287,154, Japanese Patent Publication Nos. 38(1963)-19574 and 42(1967)-446), a polymer precipitation process (described in U.S. Pat. Nos. 3,418,250 and 3,660,304), a process of forming a wall from isocyanato-polyol (described in U.S. Pat. No. 3,796,669), a process of forming a wall from isocyanate (described in U.S. Pat. No. 3,914,511), a process of forming a urea-formaldehyde or urea-formaldehyde-resorcinol wall (described in U.S. Pat. Nos. 4,001,140, 4,087,376 and 4,089,802), a process of forming a melamine-formaldehyde resin or hydroxycellulose wall (described in U.S. Pat. No. 4,025,445), an in-situ process of monomer polymerization (described in Japanese Patent Publication Nos. 36(1961)-9163 and 51(1-976)-9079), a spray-drying process (described in British Patent No. 930,422 and U.S. Pat. No. 3,111,407), or an electrolytic dispersion cooling process (described in British Patent Nos. 952,807 and 967,074).

A dispersing agent can be used to disperse microcapsules in an aqueous medium. The dispersing agent preferably is a water-soluble polymer. The water-soluble polymers include a natural polymer (e.g., polysaccharide, protein), a semi-synthetic polymer (e.g., cellulose ether, a starch derivative) and a synthetic polymer. Examples of the polysaccharides include gum arabic and sodium alginate. Examples of the proteins include casein and gelatin. Examples of the cellulose ethers include carboxymethyl cellulose and methyl cellulose. The synthetic polymer preferably is a polymer having a hydrocarbon main chain (e.g., polyvinyl alcohol, a denatured product thereof, polyacrylamide and a derivative thereof, polyvinyl pyrrolidone). A copolymer can be used as the dispersing agent. Examples of the copolymers include ethylene/vinyl acetate copolymer, styrene/maleic anhydride copolymer, ethylene/maleic anhydride copolymer, isobutylene/maleic anhydride copolymer, ethylene/acrylic acid copolymer and vinyl acetate/acrylic acid copolymer.

The water-soluble polymer preferably does not or scarcely reacts with an isocyanate compound. In the case that a polymer that is highly reactive to the isocyanate compound (e.g., gelatin) is used as the dispersing agent, the reactive groups are preferably removed or blocked before the reaction.

The microcapsule wall preferably has a three-dimensional cross-linked structure to be swelled with a solvent. The microcapsule wall is preferably made of a polyurea, a polyurethane, a polyester, a polycarbonate, a polyamide, a copolymer or a mixture thereof, and more preferably made of a polyurea, a polyurethane, a copolymer or a mixture thereof. A compound having a thermally reactive group can be introduced into the microcapsule wall.

The microcapsule has an average particle size preferably in the range of 0.01 to 3.0 μm, more preferably in the range of 0.05 to 2.0 μm, and most preferably in the range of 0.10 to 1.0 μm.

The polymer particles or the microcapsules are contained in the hydrophilic image-recording layer preferably in an amount of not less than 50 weight %, and more preferably in the range of 70 to 98 weight % in terms of the solid content.

In the case that microcapsules are contained in the hydrophilic image-recording layer, a solvent can be added to a dispersing medium of the microcapsules. The solvent has a function of dissolving the content of the microcapsules and swelling the microcapsule wall. In the case that the microcapsule wall is made of a polyurea or a polyurethane, the solvent preferably is an alcohol (e.g., methanol, ethanol, propanol, tert-3-butanol), an ether (e.g., tetrahydrofuran, propylene glycol monomethyl ether, ethylene glycol diethyl ether, ethylene glycol monomethyl ether), an acetal, an ester (e.g., methyl lactate, ethyl lactate, γ-butyrolactone), a ketone (e.g., methyl ethyl ketone), a polyhydric alcohol, an amide (e.g., dimethylformamide, N,N-dimethylacetamide), an amine or a fatty acid. Two or more solvents can be used in combination.

The amount of the solvent is preferably in the range of 5 to 95 weight more preferably in the range of 10 to 90 weight %, and most preferably in the range of 10 to 85 weight % based on the amount of the coating solution.

(Agent Capable of Converting Light to Heat)

A hydrophilic image-recording layer preferably contains an agent capable of converting light to heat.

The agent is a substance having an exothermic function of absorbing light, and converting light energy to thermal energy. Light preferably is infrared light. Accordingly, the agent capable of converting light to heat preferably is an infrared absorbing agent.

An infrared absorbing pigment, dye or metallic fine particles can be used as the agent capable of converting light to heat. In the case that microcapsules are contained in the hydrophilic image-recording layer, an infrared absorbing dye is preferably used as the agent capable of converting light to heat.

The infrared absorbing dye is described in "Handbook of Dyes (written in Japanese)", 1970, edited by The Society of Synthetic Organic Chemistry, Japan, "Near infrared absorbing dyes (written in Japanese)" of Chemical Industries p. 45-51, 1996, May, or "Development and Market of Functional Dyes in Nineties (written in Japanese)", Chapter 2, Item 2.3 (1990) C.M.C. Examples of the infrared-absorbing dye include azo dyes, metal complex salt azo dyes, pyrazolone azo dyes, naphthoquinone dyes (described in Japanese Patent Provisional Publication Nos. 58(1983)-112793, 58(1983)-224793, 59(1984)-48187, 59(1984)-73996, 60(1985)-52940 and 60(1985)-63744), anthraquinone dyes, phthalocyanine dyes (described in Japanese Patent Provisional Publication No. 11(1999)-235883), squarilium dyes (described in Japanese Patent Provisional Publication No. 58(1983)-112792), pyrylium dyes (described in U.S. Pat. Nos. 3,881,924, 4,283,475, Japanese Patent Provisional Publication Nos. 57(1982)-142645, 58(1983)-181051, 58(1983)-220143, 59(1984)-41363, 59(1984)-84248, 59(1984)-84249, 59(1984)-146063 and 59(1984)-146061, Japanese Patent Publication Nos. 5(1993)-13514 and 5(1993)-19702), carbonium dyes, quinoneimine dyes and methine dyes (described in Japanese Patent Provisional Publication Nos. 58(1983)-173696, 58(1983)-181690 and 58(1983)-194595). The methine dyes include a cyanine dye (described in Japanese Patent Provisional Publication Nos. 58(1983)-125246, 59(1984)-84356, 60(1985)-78787).

The infrared absorbing dye is also described in U.S. Pat. Nos. 4,756,993, 5,156,938, Japanese Patent Provisional Publication Nos. 10(1998)-268512 and 2004-306582. A commercially available infrared absorbing dye (e.g., Epolight III-178, Epolight III-130, Epolight III-125, available from Epolin, Inc.) can be used as the agent capable of converting light to heat.

The agent capable of converting light to heat can be contained in microcapsules. The amount of the agent is preferably in the range of 0.001 to 50 weight %, more preferably in the range of 0.005 to 30 weight %, and most preferably in the range of 0.01 to 10 weight % based on the total solid content of the hydrophilic image-recording layer.

[Polymerization Initiator]

In the case that a hydrophobic compound has a polymerizable group, a polymerization initiator can be used to cause a polymerization reaction.

The polymerization initiator generates radicals when receiving light energy, thermal energy or a combination thereof. The radical initiates or accelerates polymerization of the compound having polymerizable unsaturated groups. A known thermal polymerization initiator or a compound having a bond of small bond-dissociation energy can be used as the polymerization initiator.

Two or more radical generators can be used in combination.

The radial generator is described in Japanese Patent Provisional Publication No. 2004-306582. Examples of the radical generators include halogenated organic compounds, carbonyl compounds, organic peroxides, polymerization initiators of azo type, azide compounds, metallocene compounds, hexaarylbiimidazole compounds, organic boric compounds, disulfonic compounds, oxime esters and onium salts. The onium salts are most preferred.

[Support]

The support can be made of paper, a polymer (e.g., cellulose ester, polyester, polyethylene, polystyrene, polypropylene, polycarbonate, polyvinyl acetal) film, a metal (e.g., aluminum, zinc, copper) plate, paper laminated with a polymer, paper on which metal is deposited, or a polymer film on which metal is deposited. A polymer film or a metal plate is preferred, a polyester film and an aluminum plate is more preferred, and an aluminum plate is most preferred.

The aluminum plate is a pure aluminum plate or an aluminum alloy plate. Examples of the metals other than aluminum in the alloy include silicon, iron, manganese, copper, magnesium, chrome, zinc, bismuth, nickel and titanium. The amount of the other metals in the alloy is not more than 10 weight %.

The aluminum plate has a thickness preferably in the range of 0.1 to 0.8 mm, more preferably in the range of 0.15 to 0.6 mm, and most preferably in the range of 0.2 to 0.4 mm.

The surface of the aluminum plate is preferably subjected to roughing treatment. Before subjected to roughing treatment, the surface can be subjected to oil-removing treatment to remove the rolling oil. The oil-removing treatment can be conducted with a surface active agent, an organic solvent or an aqueous alkaline solution.

The roughing treatment can be mechanical treatment, electrochemical treatment or chemical treatment.

Examples of the mechanical roughing treatment include a ball grinding method, a brush grinding method, a blast grinding method (including a sandblast treatment) and a buff grinding method.

The electrochemical roughing treatment is, for example, a procedure in which direct or alternating current is applied to the plate in an electrolysis solution containing acid (e.g., hydrochloric acid, nitric acid). The electrolytic roughing can also be conducted by using a mixed acid (described in Japanese Patent Provisional Publication No. 54(1979)-63902).

The aluminum plate can be rolled with a roller having a rough surface to transfer the rough surface to the aluminum plate. The rough surface can also be formed with a mechanical embossing treatment. Further, a rough surface can be formed with a gravure printing. A rough surface can also be formed by coating or printing a layer containing solid particles (matting agent) on the surface of the support. The solid particles can also be added to a polymer film (internal addition) in preparation of the film to form a rough surface. Furthermore, a rough surface can be formed by a solvent treatment, a corona discharge treatment, a plasma discharge treatment, an electron beam irradiation treatment or an X-ray irradiation treatment. Two or more methods can be used in combination. A sandblust treatment, a resin printing treatment and a treatment using solid particles are particularly preferred.

After the roughing treatment, the aluminum plate is preferably subjected to an alkali etching treatment, and then a neutralizing treatment.

The aluminum plate is preferably subjected to an anodic oxidation treatment.

The electrolyte for the anodic oxidation treatment preferably forms a porous oxidation membnarne. Examples of the electrolyte include sulfuric acid, hydrochloric acid, oxalic acid, chromic acid, and mixtures thereof. The concentration is optionally determined according to the electrolyte.

The anodic oxidation treatment is preferably carried out under the following conditions: the concentration of the electrolytic solution is in the range of 1 to 80 weight %, the temperature of the solution is in the range of 5 to 70° C., the electric current density is in the range of 5 to 60 A/dm$^2$, the voltage is in the range of 1 to 100 V and the time for electrolysis is in the range of 10 seconds to 5 minutes. The oxide film formed by the anodic oxidation has a thickness of preferably 1.0 to 5.0 g/m$^2$, and more preferably 1.5 to 4.0 g/m$^2$.

[Other Optional Layers]

An undercoating layer can be provided between the support and the hydrophilic layer. The undercoating layer can have a function of improving tight adhesion between the support and the hydrophilic layer. The undercoating layer is described in Japanese Patent Provisional Publication No. 6(1994)-316183, 8(1996)-272088, 9(1997)-179311 and 2001-199175.

A protective layer can be provided on the hydrophilic image-recording layer. The protective layer can comprise a water-soluble polymer improved in crystallinity (e.g., polyvinyl alcohol). The protective layer is described in U.S. Pat. No. 3,458,311 and Japanese Patent Provisional Publication No. 55(1980)-49729.

[Presensitized Lithographic Plate]

A presensitized lithographic plate can comprise a support and a hydrophilic image-recording layer. The plate can be used, for example by changing a part of the hydrophilic image-recording layer to a hydrophobic area according to an image to form a hydrophilic area and a hydrophobic area on the image-recording layer, and supplying dampening water and oily ink to the plate to conduct printing while the dampening water is attached to the hydrophilic area and the oily ink is attached to the hydrophobic area.

The lithographic printing process using a presensitized lithographic plate which comprises a support and a hydrophilic image-recording layer which comprises the steps of: imagewise heating the presensitized lithographic plate, whereby a part of the hydrophilic layer is converted to a hydrophobic area to form a lithographic plate having a surface which comprises a hydrophilic area and the hydrophobic area; and then printing an image while supplying dampening water and oily ink to the lithographic plate.

A presensitized lithographic plate can also comprise a hydrophilic substrate (which comprises a support and a hydrophilic layer) and a hydrophobic image-recording layer. The hydrophobic image-recording layer can be classified into a positive type and a negative type. Solubility of the hydrophobic image-recording layer of the positive time in alkaline solution is increased with light exposure. On the other hand, solubility of the hydrophobic image-recording layer of the positive time in alkaline solution is decreased with light exposure. The hydrophobic image-recording layer of the positive type and the negative type are well known. Inn the case that the exposed or unexposed area of the image-recording layer can be removed with dampening water or oily ink, the lithographic plate exposed to light can directly be attached to a press machine without conducing development (process of removing exposed or unexposed area of the image-recording layer). The image-recording layer for on press development has also been proposed.

The lithographic printing process using a presensitized lithographic plate which comprises a hydrophilic substrate and the hydrophobic image-recording layer, said hydrophilic substrate comprising a support and a hydrophilic image-recording layer containing a hydrophilic polymer which comprises the steps of: imagewise removing a part of the hydrophobic image-recording layer from the presensitized lithographic plate to form a lithographic plate having a surface which comprises a hydrophilic area consisting of the exposed hydrophilic layer and a hydrophobic area consisting of the remaining hydrophobic image-recording layer; and then printing an image while supplying dampening water and oily ink to the lithographic plate. The dampening water is attached to the hydrophilic area and the oily ink is attached to the hydrophobic area.

The hydrophobic image-recording layer provided on the hydrophilic layer can contain a compound (preferably a polymer) that can be changed from hydrophilic to hydrophobic when it is heated. The hydrophobic image-recording layer can also contain thermoplastic particles, thermosetting particles or microcapsules comprising hydrophobic compound. These compounds, particles and microcapsules are the same as the agent capable of converting hydrophilic to hydrophobic to be contained in a hydrophilic image-recording layer.

The hydrophobic image-recording layer can contain an agent capable of converting light to heat or a polymerization initiator. The agent and the initiator are the same as the agent capable of converting light to heat and the polymerization initiator, which can be contained in the hydrophilic image-recording layer.

A hydrophobic substance can be directly imagewise attached on a hydrophilic layer to form a lithographic printing plate. The hydrophobic substance can be attached to the hydrophilic layer for example according to an ink-jet method (using hydrophobic droplets) or an electro photography (using hydrophobic toner).

The lithographic printing process using a hydrophilic substrate comprising a support and a hydrophilic image-recording layer comprises the steps of: imagewise attaching a hydrophobic substance to the hydrophilic substrate to form a lithographic plate having a surface which comprises a hydrophilic area consisting of the hydrophilic layer and a hydrophobic area to which the hydrophobic substance is attached; and then printing an image while supplying dampening water and oily ink to the lithographic plate. The dampening water is attached to the hydrophilic area and the oily ink is attached to the hydrophobic area.

EXAMPLE 1

(Synthesis of Hydrophilic Chain (CA-1) Having Carboxyl at Terminal End)

In 151.5 g of water, 147.8 g of potassium salt of 2-sulfopropyl methacrylate, 3.82 g of mercaptopropionic acid and 0.582 g of a polymerization initiator (VA-044, Wako Pure Chemical Industries, Ltd.) were dissolved. The obtained aqueous solution was dropwise added to 151.5 g kept at 50° C. for 2 hours in an atmosphere of nitrogen. After the addition, the mixture was stirred at 50° C. for 2 hours, and at 60° C. for 2 hours. After cooling the mixture, the mixture was gradually dropwise added to 4.5 liter of acetone to precipitate white solid.

The obtained solid was filtered out, and dried to obtain 145 g of the hydrophilic chain (CA-1) having carboxyl at the terminal end. The acid value after drying was 0.086 meq/g.

(Preparation of Aluminum Support)

Melt of JIS-A-1050 alloy containing Al (99.5 weight % or more), Fe (0.30 weight %), Si (0.10 weight %), Ti (0.02 weight %), Cu (0.013 weight %) and inevitable impurities (the rest) was cleaned and molded. For cleaning the melt, the melt was degassed to remove contaminating gases (such as hydrogen gas), and then filtrated through a ceramic tube filter. For molding the melt, the DC molding was carried out. The solidified molded metal was in the form of a plate having 500 mm thickness. The plate was planed off by 10 mm, and then subjected to uniforming treatment at 550° C. for 10 hours so that the intermetallic compounds might not agglomerate. After hot rolling at 400° C., the plate was annealed at 500° C. for 60 seconds in an annealing furnace. The plate was then subjected to cold rolling to obtain an aluminum plate having 0.30 mm thickness. The surface of the rolling mill was beforehand controlled to have such roughness that the aluminum plate might have a central surface roughness (Ra) of 0.2 μm. The aluminum plate was then installed in a tension leveler to improve flatness on the surface.

The obtained plate was subjected to the following surface treatments, to form a support of lithographic printing plate.

The rolling oil was removed form the surface of the plate, The plate was subjected to oil-removing treatment with a 10 weight % aqueous solution of sodium aluminate at 50° C. for 30 seconds. The plate was then neutralized with a 30 weight % aqueous solution of sulfuric acid at 50° C. for 30 seconds, and the smut was removed.

Next, the plate surface was subjected to roughing treatment (what is called sand roughing) to improve adhesion between the support and the image-forming layer and to make the non-imaging area keep enough water. In an aqueous solution containing nitric acid (1 weight %) and aluminum nitrate (0.5 weight %) at 45° C., the plate was subjected to electrolytic sand roughing treatment. In the treatment, while an aluminum web was left in the solution, an indirect power cell supplied an alternative current of alternative wave under the conditions of the electric current density of 20 $A/dm^2$, the duty ratio of 1:1 and the anodic electricity of 240 $C/dm^2$. After the treatment, the plate was subjected to etching treatment with a 10 weight % aqueous solution of sodium aluminate at 50° C. for 30 seconds. The plate was then neutralized with a 30 weight % aqueous solution of sulfuric acid at 50° C. for 30 seconds, and the smut was removed.

Further, for improving the abrasion resistance, the chemical resistance and the water retainment, an oxide film was formed on the support by anodic oxidation. In the film formation, while an aluminum web was left in a 20% aqueous solution of sulfuric acid at 35° C., an indirect power cell supplied a direct current of 14 $A/dm^2$ to electrolyze for forming an oxide film of 2.5 $g/m^2$.

The plate was subjected to silicate treatment to make the non-imaging area more hydrophilic. In the treatment, the plate was made contact with an aluminum web for 15 seconds in a 1.5 weight % aqueous solution of sodium silicate (No. 3) at 70° C., and washed with water. The amount of attached Si was 10 $mg/m^2$. The thus-prepared support had a central surface roughness (Ra) of 0.25 μm.

(Preparation of Microcapsule Dispersion)

In 17 g of ethyl acetate, 10 g of adduct of trimethylolpropane and xylene diisocyanate (Takenate D-110N, Mitsui Takeda Chemicals, Inc.), 3.15 g of pentaerythritol triacrylate (SR444, Nippon Kayaku), 0.35 g of the following infrared absorbing dye (1), 1 g of 3-(N,N-diethylamino)-6-methyl-7-anilinofluoran (ODM, Yamamoto Chemicals, Inc.), 0.75 g of the following polymerization initiator (1) and 0.1 g of a surface active agent (Pionin A-41C, Takemoto Oil & Fat) were dissolved to prepare an oil phase.

Independently, 40 g of 4 weight % aqueous solution of polyvinyl alcohol denatured with a carboxylic acid (KL-506, Kuraray CO., Ltd.) was prepared as an aqueous phase.

The oil and aqueous phases prepared above were mixed and emulsified with a homogenizer at 12,000 rpm for 10 minutes. The obtained emulsion was added to 25 g of distilled water, and stirred at room temperature for 30 minutes, and further stirred at 40° C. for 3 hours. The thus-prepared liquid dispersing microcapsules was diluted with distilled water so that the solid content might be 20 weight %. The mean particle size of the microcapsules was 0.4 μm.

Infrared Absorbing Dye (1)

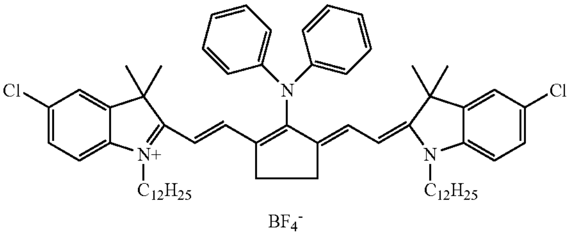

Polymerization Initiator (1)

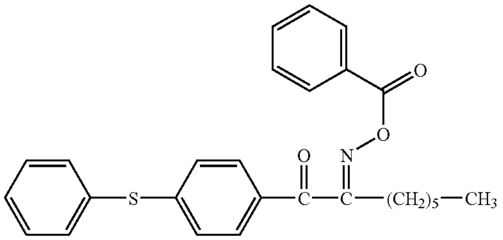

(Formation of Hydrophilic Image-Recording Layer)

The coating solution consisting of the following components was prepared and spread with a bar coater to coat the aluminum support, and then dried in an oven at 140° C. for 10 minutes to form the hydrophilic image-recording layer in a dry coating amount of 2.0 g/$m^2$. Thus, a presensitized lithographic printing plate was produced.

| Coating solution for hydrophilic layer | |
|---|---|
| Water | 100 g |
| The microcapsule dispersion (in terms of solid content) | 6.0 g |
| The hydrophilic chain (CA-1) having a reactive group at its terminal end | 2.5 g |
| The compound (1) for forming main chain | 2.5 g |
| The compound (2) for forming main chain | 1.0 g |
| Surface active agent (sodium salt of diethylhexyl sulfosuccinate) | 0.2 g |

Compound (1)

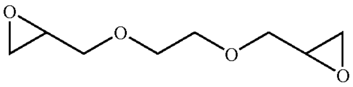

Compound (2)

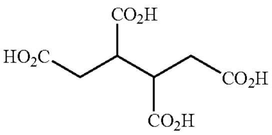

EXAMPLE 2

(Synthesis of Hydrophilic Chain (CA-2) Having Carboxyl at Terminal End)

In 70 g of ethanol, 30 g of acrylamide and 3.8 g of 3-mercaptopropionic acid were dissolved. The obtained solution was heated to 60° C. in an atmosphere of nitrogen. To the heated solution, 300 mg of 2,2-azobisisobutyronitrile (AIBN, thermal polymerization initiator) were added. The mixture reacted for 6 hours. After reaction, while precipitates were filtered out, and well washed with methanol to obtain 30.8 g of the hydrophilic chain (CA-2) having carboxyl at is terminal end. The acid value after drying was 0.086 meq/g. The molecular weight was $1.29 \times 10^3$.

(Preparation of Presensitized Lithographic Plate)

A presensitized lithographic plate was prepared in the same manner as in Example 1, except that the hydrophilic chain (CA-2) was used in place of (CA-1).

EXAMPLE 3

A presensitized lithographic plate was prepared in the same manner as in Example 1, except that the hydrophilic chain (AM-2) was used in place of (CA-1), and the compound (3) was used in place of the compound (1).

Compound (3)

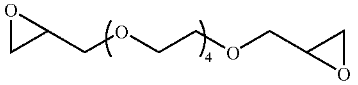

EXAMPLE 4

A presensitized lithographic plate was prepared in the same manner as in Example 1, except that the hydrophilic chain (DB-1) was used in place of (CA-1), the compound (3) was used in place of the compound (1), and the compound (4) was used in place of the compound (2).

Compound (4)

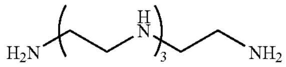

EXAMPLE 5

A presensitized lithographic plate was prepared in the same manner as in Example 1, except that the following coating solution for hydrophilic layer was used.

| Coating solution for hydrophilic layer | |
|---|---|
| Water | 100 g |
| The microcapsule dispersion used in Example 1 (in terms of solid content) | 6.0 g |
| The hydrophilic chain (CA-1) having a reactive group at its terminal end | 2.5 g |
| Sorbitol polyglycidyl ether (compound (5) for forming main chain, Denacol EX-614-B, Nagase ChemteX Corporation) | 3.5 g |
| Surface active agent (sodium salt of diethylhexyl sulfosuccinate) | 0.2 g |

EXAMPLE 6

A presensitized lithographic plate was prepared in the same manner as in Example 1, except that the following coating solution for hydrophilic layer was used.

| Coating solution for hydrophilic layer | |
|---|---|
| Water | 100 g |
| The microcapsule dispersion used in Example 1 (in terms of solid content) | 6.0 g |
| The hydrophilic chain (CA-1) having a reactive group at its terminal end | 2.5 g |
| The compound (1) for forming main chain | 2.5 g |
| The compound (4) for forming main chain | 1.0 g |
| Surface active agent (sodium salt of diethylhexyl sulfosuccinate) | 0.2 g |

EXAMPLE 7

A presensitized lithographic plate was prepared in the same manner as in Example 1, except that the following coating solution for hydrophilic layer was used.

| Coating solution for hydrophilic layer | |
|---|---|
| Water | 100 g |
| The microcapsule dispersion used in Example 1 (in terms of solid content) | 6.0 g |
| The hydrophilic chain (CA-1) having a reactive group at its terminal end | 2.5 g |
| The compound (1) for forming main chain | 2.5 g |
| Polyacrylic acid (compound (6) for forming main chain, mass average molecular weight: 5,000) | 0.5 g |
| Surface active agent (sodium salt of diethylhexyl sulfosuccinate) | 0.2 g |

Comparison Example 1

A presensitized lithographic plate was prepared in the same manner as in Example 1, except that the hydrophilic chain (CA-1) was not used.

Comparison Example 2

A presensitized lithographic plate was prepared in the same manner as in Example 1, except that the compound (2) for forming the main chain was not used.

Comparison Example 3

A presensitized lithographic plate was prepared in the same manner as in Example 7, except that the hydrophilic chain (CA-1) was not used.

(Evaluation of Presensitized Plate)

Each of the above-produced presensitized plates was imagewise exposed by means of an image exposing machine (Trendsetter 3244VX, Creo) equipped with a water-cooling semiconductor infrared laser of 40 W. The exposing conditions were so adjusted that output was 9 W, the outer drum rotation was 210 rpm, and the resolution was 2,400 dpi. The exposed image contains fine-line chart.

Without subjecting to the developing process, the exposed plate was immediately installed on a cylinder of printing machine (SOR-M, Heidelberg). As the dampening water, a mixture of etching solution (EU-3, Fuji Photo Film Co., Ltd.)/water/isopropanol (=1/89/10 by volume) was supplied. While black ink (Barius(N), Dainippon Ink & Chemicals, Inc.) was further supplied, 500 sheets of paper were printed at the rate of 6,000 sheets per hour.

After the ink was attached to the plate surface, the dampening water was supplied to the plate. Number of paper was counted until the ink was removed from the plate and the contamination on background of the printed matter was not observed. Then paper was printed until the background was contaminated.

(1) Contamination on Background

After 500 sheets of paper were printed, the amount of attached ink (on background) within the non-image area on the printed paper was observed. The contamination on background was determined whether the ink was attached to the non-image area or not. Even if a small amount of the ink was attached to the area, it was decided that the contamination on background was caused.

(2) Repellency of Ink

The number of paper was counted until the ink was removed from the plate. A hydrophilic layer having an excellent hydrophilic function shows a result of small number of paper.

(3) Plate Wear

According as the sheets of printed paper increased, the image-recording layer gradually wore down and less received ink so that the density of ink on the printed paper was lowered. It was counted how many sheets of paper were printed until the background was contaminated. The results were set forth in Table 1.

TABLE 1

| Presensitized lithographic plate | Hydrophilic chain | Compound for forming main chain | Contamination in background | Repellency of ink | Plate wear |
|---|---|---|---|---|---|
| Example 1 | CA-1 | (1) + (2) | None | 10 | 10,000 |
| Example 2 | CA-2 | (1) + (2) | None | 5 | 12,000 |
| Example 3 | AM-2 | (2) + (3) | None | 15 | 12,000 |
| Example 4 | DB-1 | (3) + (4) | None | 20 | 12,000 |
| Example 5 | CA-1 | (5) | None | 35 | 15,000 |
| Example 6 | CA-1 | (1) + (4) | None | 40 | 10,000 |
| Example 7 | CA-1 | (6) + (1) | None | 35 | 15,000 |
| Comp. Ex. 1 | None | (1) + (2) | None | 200 | 1,000 |
| Comp. Ex. 2 | CA-1 | (1) | Observed | —(*) | 0 |
| Comp. Ex. 3 | None | (6) + (1) | Observed | 500 | 5,000 |

(Remark)
Compound (5): Sorbitol polyglycidyl ether
Compound (6): Polyacrylic acid
—(*): Impossible for printing

EXAMPLE 8

The coating solution consisting of the following components was prepared and spread with a bar coater to coat the aluminum support prepared in Example 0.1, and then dried in an oven at 140° C. for 10 minutes to form the hydrophilic image-recording layer in a dry coating amount of 2.0 g/$m^2$. Thus, a presensitized lithographic printing plate was produced.

| Coating solution for hydrophilic layer | |
|---|---|
| Water | 100 g |
| The microcapsule dispersion (in terms of solid content) | 6.0 g |
| The hydrophilic chain (EP-1) having a reactive group at its terminal end | 2.5 g |
| Polyethyleneimine having mass average molecular weight of 10,000 (compound A1 for forming main chain) | 2.0 g |
| 1,2,3,4-Butanetetracarboxylic acid (compound B1 for forming main chain) | 1.5 g |
| Surface active agent (sodium salt of diethylhexyl sulfosuccinate) | 0.2 g |

EXAMPLE 9

A presensitized lithographic plate was prepared in the same manner as in Example 8, except that the following coating solution for hydrophilic layer was used.

| Coating solution for hydrophilic layer | |
|---|---|
| Water | 100 g |
| The microcapsule dispersion used in Example 1 (in terms of solid content) | 6.0 g |
| The hydrophilic chain (CA-1) having a reactive group at its terminal end | 2.5 g |
| 3,6,9-Tetraaza-1,11-undecanediamine (compound A2 for forming main chain) | 2.5 g |
| 1,2,3,4-Butanetetracarboxylic acid (compound B1 for forming main chain) | 1.0 g |
| Surface active agent (sodium salt of diethylhexyl sulfosuccinate) | 0.2 g |

EXAMPLE 10

A presensitized lithographic plate was prepared in the same manner as in Example 8, except that the hydrophilic chain (CA-1) was used in place of (EP-1).

EXAMPLE 11

A presensitized lithographic plate was prepared in the same manner as in Example 8, except that the following coating solution for hydrophilic layer was used.

| Coating solution for hydrophilic layer | |
|---|---|
| Water | 100 g |
| The microcapsule dispersion used in Example 1 (in terms of solid content) | 6.0 g |
| The hydrophilic chain (AM-1) having a reactive group at its terminal end | 2.5 g |
| Polyacrylic acid having mass average molecular weight of 10,000 (compound A3 for forming main chain) | 2.0 g |
| 3,6,9-Tetraaza-1,11-undecanediamine (compound B2 for forming main chain) | 1.5 g |
| Surface active agent (sodium salt of diethylhexyl sulfosuccinate) | 0.2 g |

EXAMPLE 12

A presensitized lithographic plate was prepared in the same manner as in Example 9, except that the hydrophilic chain (EP-1) was used in place of (CA-1).

EXAMPLE 13

A presensitized lithographic plate was prepared in the same manner as in Example 11, except that the hydrophilic chain (EP-1) was used in place of (AM-3).

EXAMPLE 14

A presensitized lithographic plate was prepared in the same manner as in Example 8, except that the following coating solution for hydrophilic layer was used.

| Coating solution for hydrophilic layer | |
|---|---|
| Water | 100 g |
| The microcapsule dispersion used in Example 1 (in terms of solid content) | 6.0 g |
| The hydrophilic chain (EP-1) having a reactive group at its terminal end | 2.5 g |
| Polyethyleneimine having mass average molecular weight of 10,000 (compound A1 for forming main chain) | 2.0 g |
| Polyacrylic acid having mass average molecular weight of 5,000 (compound B3 for forming main chain) | 1.5 g |
| Surface active agent (sodium salt of diethylhexyl sulfosuccinate) | 0.2 g |

(Evaluation of Presensitized Plate)

Each of the above-produced presensitized plates was imagewise exposed by means of an image exposing machine (Trendsetter 3244VX, Creo) equipped with a water-cooling semiconductor infrared laser of 40 W. The exposing conditions were so adjusted that output was 9 W, the outer drum rotation was 210 rpm, and the resolution was 2,400 dpi. The exposed image contains fine-line chart.

Without subjecting to the developing process, the exposed plate was immediately installed on a cylinder of printing machine (SOR-M, Heidelberg). As the dampening water, a mixture of etching solution (EU-3, Fuji Photo Film Co., Ltd.)/water/isopropanol (=1/89/10 by volume) was supplied. While black ink (Barius(N), Dainippon Ink & Chemicals, Inc.) was further supplied, 500 sheets of paper were printed at the rate of 6,000 sheets per hour.

After the ink was attached to the plate surface, the dampening water was supplied to the plate. Number of paper was counted until the ink was removed from the plate and the contamination on background of the printed matter was not observed. Then paper was printed until the background was contaminated.

(1) Contamination on Background

After 500 sheets of paper were printed, the amount of attached ink (on background) within the non-image area on the printed paper was observed. The contamination on background was determined whether the ink was attached to the non-image area or not. Even if a small amount of the ink was attached to the area, it was decided that the contamination on background was caused.

(2) Repellency of Ink

The number of paper was counted until the ink was removed from the plate. A hydrophilic layer having an excellent hydrophilic function shows a result of small number of paper.

(3) Plate Wear

According as the sheets of printed paper increased, the image-recording layer gradually wore down and less received ink so that the density of ink on the printed paper was lowered.

It was counted how many sheets of paper were printed until the background was contaminated. The results were set forth in Table 2.

TABLE 2

| Presensitized lithographic plate | Hydrophilic chain | Compound for forming main chain | Contamination in background | Repellency of ink | Plate wear |
|---|---|---|---|---|---|
| Example 8 | EP-1 | A1 + B1 | None | 15 | 18,000 |
| Example 9 | CA-1 | A2 + B2 | None | 10 | 10,000 |
| Example 10 | CA-1 | A1 + B1 | None | 5 | 15,000 |
| Example 11 | AM-3 | A3 + B2 | None | 10 | 18,000 |
| Example 12 | EP-1 | A2 + B2 | None | 15 | 12,000 |
| Example 13 | EP-1 | A3 + B2 | None | 20 | 20,000 |
| Example 14 | EP-1 | A1 + B3 | None | 15 | 18,000 |

(Remark)
Compound A1: Polyethyleneimine (mass average molecular weight: 10,000)
Compound A2: 3,6,9-Tetraaza-1,11-undecaneamine
Compound A3: Polyacrylic acid (mass average molecular weight: 10,000)
Compound B1: 1,2,3,4-Butanetetracarboxylic acid
Compound B2: 3,6,9-Tetraaza-1,11-undecaneamine
Compound B3: Polyacrylic acid (mass average molecular weight: 5,000)

EXAMPLE 15

(Preparation of Hydrophilic Substrate)

A surface of a polyethylene terephthalate film having thickness of 0.24 mm was subjected to a corona discharge treatment to obtain a support.

A coating solution consisting of the following components was prepared and spread with a bar coater to coat the support, and then dried in an oven at 140° C. for 10 minutes to form the hydrophilic layer in a dry coating amount of 1.0 g/$m^2$. Thus, a hydrophilic substrate was produced.

| Coating solution for hydrophilic layer | |
|---|---|
| Water | 2,500 g |
| The hydrophilic chain (CA-1) having a reactive group at its terminal end | 60 g |
| The compound (1) for forming main chain | 25 g |
| Polyacrylic acid having mass average molecular weight of 100,000 | 20 g |
| 20 Weight % aqueous dispersion of colloidal silica (Snowtex C, Nissan Chemical Industries, Ltd.) | 1,200 g |
| 5 Weight % aqueous solution of a surface active agent (sodium salt of diethylhexyl sulfosuccinate) | 0.2 g |

(Preparation of Light-Sensitive Liquid)

A light-sensitive liquid of the following composition was prepared.

| Light-sensitive liquid | |
|---|---|
| The binder polymer (1) | 16 g |
| The polymerization initiator (2) | 10 g |
| The infrared absorbing dye (1) | 2 g |
| Polymerizable monomer (Aronix M-215, Toagosei Co., Ltd.) | 40 g |
| The fluorine-contained surface active agent (1) | 4 g |
| Methyl ethyl ketone | 110 g |
| 1-Methoxy-2-propanol | 860 g |

-continued

Light-sensitive liquid

Binder polymer (1)

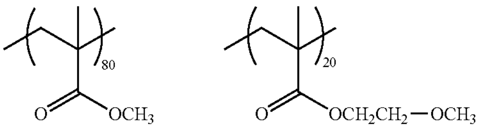

Polymerization initiator (2)

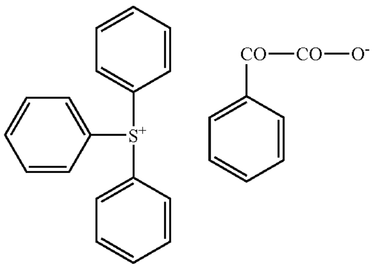

Fluorine-contained surface active agent (1)

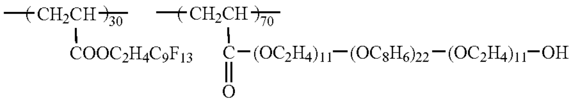

(Preparation of Microcapsule Dispersion)

In 16.67 g of ethyl acetate, 10 g of 75 weight % ethyl acetate solution of an adduct of trimethylolpropane and xylene diisocyanate (Takenate D-110N, Mitsui Takeda Chemicals, Inc.), 6.00 g of ethylenically unsaturated monomer (Aronix M-215, Toagosei Co., Ltd.) and 0.12 g of a surface active agent (Pionin A-41C, Takemoto Oil & Fat) were dissolved to prepare an oil phase.

Independently, 37.5 g of 4 weight % aqueous solution of polyvinyl alcohol (PVA-205, Kuraray CO., Ltd.) was prepared as an aqueous phase.

The oil and aqueous phases prepared above were mixed and emulsified with a homogenizer at 12,000 rpm for 10 minutes. The obtained emulsion was added to 25 g of distilled water, and stirred at room temperature for 30 minutes, and further stirred at 40° C. for 2 hours. The thus-prepared liquid dispersing microcapsules was diluted with distilled water so that the solid content might be 15 weight %. The mean particle size of the microcapsules was 0.2 μm.

(Preparation of Microcapsule Liquid)

A microcapsule liquid of the following composition was prepared.

| Microcapsule liquid | |
|---|---|
| The microcapsule dispersion | 260 g |
| Water | 240 g |

(Formation of Hydrophobic Image-Recording Layer)

The light-sensitive liquid and the microcapsule liquid were mixed to prepare a coating solution of a hydrophobic image-recording layer.

Immediately after preparation, the coating solution was spread with a bar coater to coat the hydrophilic substrate, and then dried in an oven at 100° C. for 60 seconds to form a hydrophobic image-recording layer in a dry coating amount of 1.0 g/$m^2$.

(Preparation of Inorganic Particle Dispersion)

To 193.6 g of ion-exchanged water, 6.4 g of synthetic mica (Somashif ME-100, CO-OP Chemical Co., Ltd.) was added. The mixture was stirred using a homogenizer to form a dispersion having an average particle size of 3 μm, which was measured according to a laser scattering 1.0 method. The aspect ratio of the dispersed inorganic particles was 100 or more.

(Preparation of Presensitized Lithographic Plate for On Press Development)

The coating solution for the protective layer having the following was spread with a bar coater to coat the hydrophobic image recording layer, and then dried in an oven at 120° C. for 60 seconds to form a protective layer in a dry coating amount of 0.15 g/$m^2$.

Thus a presensitized lithographic plate for on press development was prepared.

| Coating solution for protective layer | |
|---|---|
| The inorganic particle dispersion | 150 g |
| Polyvinyl alcohol (PVA105, Kuraray Co., Ltd., saponification degree: 98.5 mole %, polymerization degree: 500) | 6 g |
| Polyvinyl pyrrolidone (K30, Tokyo Kasei Kogyo Co., Ltd., mass average molecular weight: 40,000) | 1 g |
| Vinyl pyrrolidone/vinyl acetate copolymer (LUVITEC VA64W, ICP, copolymerization ratio: 6/4) | 1 g |
| Nonionic surface active agent (Emalex 710, Nihon Emulsion Co., Ltd.) | 1 g |
| Ion-exchanged water | 600 g |

(Evaluation of Presensitized Lithographic Plate)

The above-produced presensitized lithographic plate was imagewise exposed by means of an image exposing machine (Trendsetter 3244VX, Creo) equipped with a water-cooling semiconductor infrared laser of 40 W. The exposing conditions were so adjusted that output was 9 W, the outer drum rotation was 210 rpm, and the resolution was 2,400 dpi. The exposed image contains fine-line chart.

Without subjecting to the developing process, the exposed plate was immediately installed on a cylinder of printing machine (SOR-M, Heidelberg). As the dampening water, a mixture of etching solution (EU-3, Fuji Photo Film Co., Ltd.)/water/isopropanol (=1/89/10 by volume) was supplied. While black ink (TRANS-G(N), Dainippon Ink & Chemicals, Inc.) was further supplied, paper was printed at the rate of 6,000 sheets per hour. Thus 10,000 sheets of paper were printed without causing contamination in the background.

EXAMPLE 16

(Preparation of Resin Particles)

A mixture of 14 g of polydodecyl methacrylate, 100 g of vinyl acetate, 4.0 g of octadecyl methacrylate, and 286 g of Isoper H was heated to 70° C. while stirring under a stream of nitrogen. To the mixture, 1.5 g of 2,2'-azobis(isovaleronitrile) was added, and the resulting mixture reacted for 4 hours. To the mixture, 0.8 g of 2,2'-azobis(isobutyronitrile) was added, and the resulting mixture was heated to 80° C. to react for 2 hours. The mixture was heated to 100° C., and stirred for 1 hours. The remaining monomer was distilled off. After cooling the mixture was filtered through a Nylon cloth of 200 mesh to obtain white dispersion. The dispersion was a latex having average particle size of 0.35 μm. The particle size was measured by CAPA-500 (Horiba, Ltd.). The polymerization rate was 93%.

(Preparation of Oily Ink)

In a paint shaker (Toyo Seiki Seisaku-sho, Ltd.), 10 g of dececyl methacrylate/acrylic acid copolymer (copolymerization mass ratio: 98/2), 10 g of Alkali Blue and 71.30 g of Shellsol were placed with glass beads. The mixture was stirred for 4 hours to obtain a fine blue dispersion of the Alkali Blue.

With 1 liter of Isober G, 50 g (solid content) of the resin particles, 5 g (solid content) of the blue dispersion and zirconium naphthenate to obtain oily blue ink.

(Preparation of Lithographic Plate According to Ink-Jet Method)

A servo plotter DA8400 (Graphtec) for output of a personal computer was modified. An ink-jet head was attached in place of a pen plotter, and the hydrophilic substrate prepared in Example 15 was placed on counter electrodes, which were aligned with a space of 1.5 mm. The surface of the hydrophilic substrate was printed with the prepared oily ink to prepared a lithographic plate. An aluminum backing layer formed on the substrate was electrically connected with silver paste to the counter electrode.

The surface of the obtained plate was heated at 70° C. for 10 seconds with a Ricoh Fuser (Ricoh Co., Ltd.) to fix the ink image. The obtained image on the plate was magnified 5000 times under an optical microscope. As a result, a clear image having neither blur nor break in minute line or character was observed.

(Evaluation of Lithographic Plate)

The obtained plate was installed on a cylinder of printing machine (SOR-M, Heidelberg). As the dampening water, a mixture of etching solution (EU-3, Fuji Photo Film Co., Ltd.)/water/isopropanol (=1/89/10 by volume) was supplied. While black ink (TRANS-G(N), Dainippon Ink & Chemicals, Inc.) was further supplied, paper was printed at the rate of 6,000 sheets per hour. Thus 5,000 sheets of paper were printed without causing contamination in the background.

We claim:

1. A presensitized lithographic plate which comprises a support and a hydrophilic image-recording layer containing a hydrophilic polymer and an agent capable of converting hydrophilic to hydrophobic when the agent is heated, wherein the hydrophilic polymer comprises a main chain and branched chains, each of said branched chain comprising a hydrophilic chain and a linking group, said hydrophilic chain having a mass average molecular weight in the range of 200 to 1,000,000, and said linking group intervening between the main chain and the hydrophilic chain, wherein the agent capable of converting hydrophilic to hydrophobic is a microcapsule containing a hydrophobic compound, and wherein the hydrophilic chain comprises repeating units, each of said repeating units having at least one hydrophilic group.

2. The presensitized lithographic plate as defined in claim 1, wherein the linking group comprises an ionic bond.

3. The presensitized lithographic plate as defined in claim 1, wherein the main chain comprises at least two kinds of repeating units.

4. The presensitized lithographic plate as defined in claim 3, wherein the branched chain is attached to only one kind of the repeating units of the main chain.

5. The presensitized lithographic plate as defined in claim 4, wherein the branched chain comprises a hydrophilic chain and a linking group, said linking group intervening between the main chain and the hydrophilic chain, and wherein another kind of the repeating units of the main chain has the same molecular structure as the linking group.

6. The presensitized lithographic plate as defined in claim 1, wherein the main chain has a mass average molecular weight in the range of 1,000 to 2,000,000.

7. The presensitized lithographic plate as defined in claim 1, wherein the main chain has a cross-linked structure.

8. The presensitized lithographic plate as defined in claim 7, wherein the cross-linked structure comprises an ionic bond.

9. A hydrophilic substrate which comprises a support and a hydrophilic layer containing a hydrophilic polymer, wherein the hydrophilic polymer comprises a main chain and branched chains, each of said branched chain comprising a hydrophilic chain and a linking group, said hydrophilic chain having a mass average molecular weight in the range of 200 to 1,000,000, and said linking group intervening between the main chain and the hydrophilic chain, and wherein the hydrophilic chain is a polymer of ethylenically unsaturated monomers having a hydrophilic group.

10. A lithographic printing process which comprises the steps of:

imagewise heating a presensitized lithographic plate which comprises a support and a hydrophilic image-recording layer containing a hydrophilic polymer and an agent capable of converting hydrophilic to hydrophobic when the agent is heated, wherein the hydrophilic polymer comprises a main chain and branched chains, each of said branched chain comprising a hydrophilic chain and a linking group, said hydrophilic chain having a mass average molecular weight in the range of 200 to 1,000,000, and said linking group intervening between the main chain and the hydrophilic chain, wherein the agent capable of converting hydrophilic to hydrophobic is a microcapsule containing a hydrophobic compound, and wherein the hydrophilic chain comprises repeating units, each of said repeating units having at least one hydrophilic group, whereby a part of the hydrophilic layer is converted to a hydrophobic area to form a lithographic plate having a surface which comprises a hydrophilic area and the hydrophobic area; and then printing an image while supplying dampening water and oily ink to the lithographic plate.

11. A lithographic printing process which comprises the steps of:

imagewise removing a part of a hydrophobic image-recording layer from a presensitized lithographic plate which comprises a hydrophilic substrate and the hydrophobic image-recording layer, said hydrophilic substrate comprising a support and a hydrophilic image-recording layer containing a hydrophilic polymer, wherein the hydrophilic polymer comprises a main chain and branched chains, each of said branched chain comprising a hydrophilic chain and a linking group, said hydrophilic chain having a mass average molecular weight in the range of 200 to 1,000,000, and said linking group intervening between the main chain and the hydrophilic chain, and wherein the hydrophilic chain is a polymer of ethylenically unsaturated monomers having a hydrophilic group to form a lithographic plate having a surface which comprises a hydrophilic area consisting of the exposed hydrophilic layer and a hydrophobic area consisting of the remaining hydrophobic image-recording layer; and then printing an image while supplying dampening water and oily ink to the lithographic plate.

12. A lithographic printing process which comprises the steps of:

imagewise attaching a hydrophobic substance to a hydrophilic substrate comprising a support and a hydrophilic image-recording layer containing a hydrophilic polymer, wherein the hydrophilic polymer comprises a main chain and branched chains, each of said branched chain comprising a hydrophilic chain and a linking group, said hydrophilic chain having a mass average molecular weight in the range of 200 to 1,000,000, and said linking group intervening between the main chain and the hydrophilic chain, and wherein the hydrophilic chain is a polymer of ethylenically unsaturated monomers having a hydrophilic group to form a lithographic plate having a surface which comprises a hydrophilic area consisting of the hydrophilic layer and a hydrophobic area to which the hydrophobic substance is attached; and then printing an image while supplying dampening water and oily ink to the lithographic plate.

13. The presensitized lithographic plate as defined in claim 1, and wherein the hydrophilic chain is a polymer of ethylenically unsaturated monomers having a hydrophilic group.

14. The lithographic printing process as defined in claim 10, and wherein the hydrophilic chain is a polymer of ethylenically unsaturated monomers having a hydrophilic group.

* * * * *